United States Patent
Cascone et al.

(10) Patent No.: US 7,888,873 B2
(45) Date of Patent: *Feb. 15, 2011

(54) DYNAMIC DEPRESSED COLLECTOR

(75) Inventors: Michael J. Cascone, Sunnyvale, CA (US); John Arthur Lazar, Jr., Menlo Park, CA (US); John Brinson Overstreet, Los Gatos, CA (US)

(73) Assignee: Communications and Power Industries, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/075,870

(22) Filed: Mar. 14, 2008

(65) Prior Publication Data

US 2008/0164816 A1 Jul. 10, 2008

Related U.S. Application Data

(63) Continuation of application No. 11/347,357, filed on Feb. 3, 2006, now Pat. No. 7,368,874.

(51) Int. Cl.
*H01J 23/02* (2006.01)

(52) U.S. Cl. .......................... 315/5.38; 315/3.5; 330/43

(58) Field of Classification Search ................. 315/3.5, 315/5, 5.38; 330/4.5, 4.6, 4.7, 43, 44, 127, 330/199
See application file for complete search history.

(56) References Cited

U.S. PATENT DOCUMENTS

| | | | |
|---|---|---|---|
| 3,165,696 A | 1/1965 | Poole | |
| 3,325,677 A | 6/1967 | Orr | |
| 3,644,778 A | 2/1972 | Mihran et al. | |
| 3,697,799 A | 10/1972 | Caldwell et al. | |
| 3,916,246 A * | 10/1975 | Preist | 315/5 |
| RE28,782 E | 4/1976 | Caldwell et al. | |
| 4,096,409 A | 6/1978 | Hechtel | |
| 4,101,804 A | 7/1978 | Carlsson | |

(Continued)

FOREIGN PATENT DOCUMENTS

GB 2369488 A 5/2002

(Continued)

OTHER PUBLICATIONS

J.X. Qiu et al., "Efficiency Enhancement of Traveling-Wave Tube Amplifier with Dynamically Adjusted Collector Bias Voltages", IVEC, May 2007, 2 pgs.

(Continued)

*Primary Examiner*—Douglas W Owens
*Assistant Examiner*—Tung X Le
(74) *Attorney, Agent, or Firm*—Nixon Peabody LLP; David B. Ritchie

(57) ABSTRACT

A biasing system for use with a multi-stage depressed collector of a high power amplifier includes one or more adjustable power sources. A power controller provides control signals to the power sources depending on the operational RF power level. For low power applications, biasing of collector electrodes is reduced such that savings in energy costs are realized, and operational temperature and wear are reduced. The control signals are based on values stored in a look-up table. For multiple depressed electrodes, biasing can be controlled in tandem or independently.

3 Claims, 5 Drawing Sheets

U.S. PATENT DOCUMENTS

| | | | |
|---|---|---|---|
| 4,118,671 A | 10/1978 | Connolly | |
| 4,219,758 A | 8/1980 | Karp | |
| 4,277,721 A | 7/1981 | Kosmahl | |
| 4,296,354 A | 10/1981 | Neubauer | |
| 4,323,853 A | 4/1982 | Kurokawa | |
| 4,562,407 A | 12/1985 | Wassermann et al. | |
| 4,794,303 A * | 12/1988 | Hechtel et al. | 315/5.38 |
| 4,866,344 A | 9/1989 | Ross et al. | |
| 4,933,594 A | 6/1990 | Faillon et al. | |
| 5,418,425 A | 5/1995 | Bachmor et al. | |
| 5,550,432 A | 8/1996 | Barker | |
| 5,568,014 A * | 10/1996 | Aoki et al. | 315/3.5 |
| 5,650,751 A | 7/1997 | Symons | |
| 5,834,971 A | 11/1998 | Giguere et al. | |
| 6,111,358 A * | 8/2000 | Cardwell et al. | 315/3.5 |
| 6,208,079 B1 * | 3/2001 | Brown, II | 315/3.5 |
| 6,232,721 B1 | 5/2001 | Danielsons | |
| 6,262,536 B1 | 7/2001 | Symons | |
| 6,326,730 B1 | 12/2001 | Symons | |
| 6,356,023 B1 | 3/2002 | Kosmahl | |
| 6,380,803 B2 | 4/2002 | Symons | |
| 6,590,450 B2 | 7/2003 | Chen et al. | |
| 6,909,235 B2 | 6/2005 | Wolkstein et al. | |
| 7,034,463 B2 * | 4/2006 | Nobe | 315/3.5 |
| 7,138,860 B2 | 11/2006 | Eng | |
| 7,474,148 B2 * | 1/2009 | Bel | 330/45 |
| 2001/0011924 A1 * | 8/2001 | Symons | 330/45 |
| 2001/0024091 A1 * | 9/2001 | Tsuida et al. | 315/3.5 |
| 2002/0036470 A1 * | 3/2002 | Tsuida et al. | 315/5.37 |
| 2002/0157793 A1 * | 10/2002 | Cox et al. | 156/345.48 |
| 2004/0000947 A1 | 1/2004 | Luu | |
| 2004/0224635 A1 | 11/2004 | Nicol et al. | |
| 2006/0103460 A1 * | 5/2006 | Eng | 330/43 |

FOREIGN PATENT DOCUMENTS

| | | |
|---|---|---|
| JP | 61163536 | 7/1986 |
| JP | 63094537 | 4/1988 |
| JP | 05315864 | 11/1993 |
| JP | 06177673 | 6/1994 |
| WO | WO 02/25684 A1 | 3/2002 |

OTHER PUBLICATIONS

International Search Report, International Application No. PCT/US2006/005667, date mailed Jun. 30, 2006.

* cited by examiner

DYNAMIC DEPRESSED COLLECTOR

CROSS-REFERENCE TO RELATED APPLICATIONS

This application is a continuation of U.S. patent application Ser. No. 11/347,357, entitled "Dynamic Depressed Collector," filed on Feb. 3, 2006.

FIELD OF THE INVENTION

The invention relates to high power amplifiers, and more particularly, to high power amplifiers having a multi-stage depressed collector (MSDC).

BACKGROUND OF THE INVENTION

Conventional multi-stage depressed collectors (MSDCs) used with electron tubes of high power amplifiers such as a traveling wave tube (TWT), klystron, extended interaction klystron (EIK), inductive output tube (IOT), and a coupled cavity traveling wave tube (CCTWT) use a fixed depression ratio, such as thirty three percent and sixty six percent (33/66). This ratio(s) is chosen to work at the maximum power of the device, usually saturation. If the depression voltage is too close to the cathode voltage, electrons will be returned to the body, causing thermal overload and/or spurious signals. FIG. 1 shows schematically a conventional high power amplifier 100 having a cathode 102, an anode 104, and a multi-stage depressed collector consisting of two collector stage electrodes, 106a and 106b. During normal operation at maximum power (saturation), the voltage of first collector stage electrode 106a is kept at about 66% of the cathode potential, while second (106b) collector stage electrode is kept at about 33% of the cathode potential. These percentages are provided by fixed power sources 108 and 110, and this is implemented irrespective of the power level of operation.

SUMMARY OF THE INVENTION

In accordance with the invention, one or more elements of a multi-stage depressed collector (MSDC) are dynamically adjusted in voltage based on the operating conditions of the electron tube or power amplifier. In accordance with an aspect of the invention, there is provided a biasing system for an electron tube having at least two collector stages. The biasing system includes at least one adjustable power source for biasing an electrode of one of the collector stages, and a power controller for driving the adjustable power source.

In accordance with another aspect of the invention, there is provided a power amplifier including an electron tube. The power amplifier is provided with an anode, cathode, collector having at least one depressed collector, an adjustable power source connected to the depressed collector and a power controller for driving the adjustable power source to achieve a biasing voltage at the depressed collector.

In accordance with another aspect of the invention, there is provided a biasing system for a multi-stage depressed collector including at least a first depressed collector electrode. The biasing system includes a first adjustable power source electrically coupled to the first depressed collector electrode, the first adjustable power source biasing the first depressed collector electrode at a voltage level that is based upon a first control signal The biasing system in accordance with this aspect further includes a power controller providing the first control signal to the first adjustable power source, the first control signal having at least a high power value for high power operation and a low power value for low power operation.

In accordance with another aspect of the invention, there is provided a method for biasing at least a first depressed collector electrode of a multi-stage depressed collector of a power amplifier. The method includes determining RF operational power of the power amplifier, and adjustably controlling a first power source coupled to the at least first depressed collector electrode in accordance with the determined RF operational power.

In accordance with another aspect of the invention, there is provided a biasing system for at least a first depressed collector electrode of a multi-stage depressed collector, the system including means for determining RF operational power, and means for adjustably controlling a first power source coupled to the at least first depressed collector electrode in accordance with the determined RF operational power.

BRIEF DESCRIPTION OF THE SEVERAL VIEWS OF THE DRAWINGS

Many advantages of the present invention will be apparent to those skilled in the art with a reading of this specification in conjunction with the attached drawings, wherein like reference numerals are applied to like elements, and wherein.

DESCRIPTION OF THE PREFERRED EMBODIMENTS OF THE INVENTION

Figure 1:
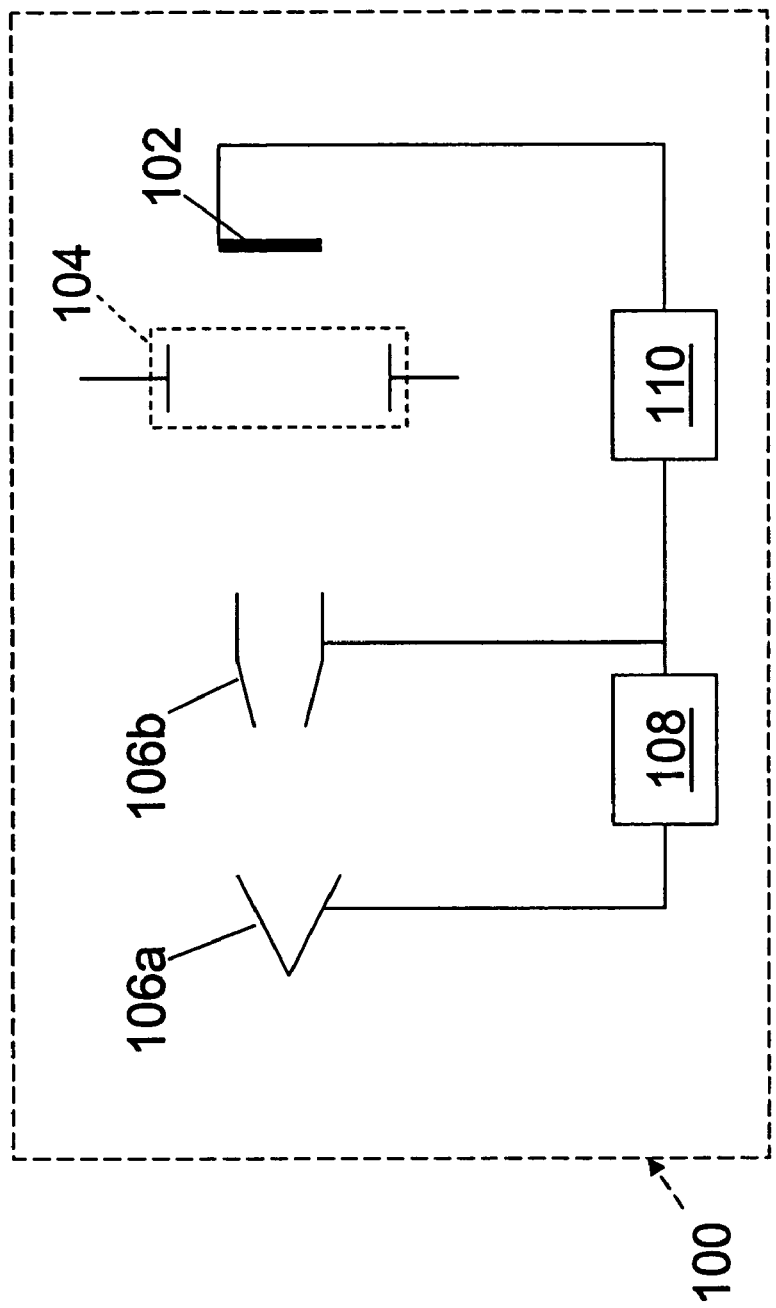
FIG. 1 is a schematic diagram of a conventional high power amplifier having a two-stage MSDC.
Figure 2:
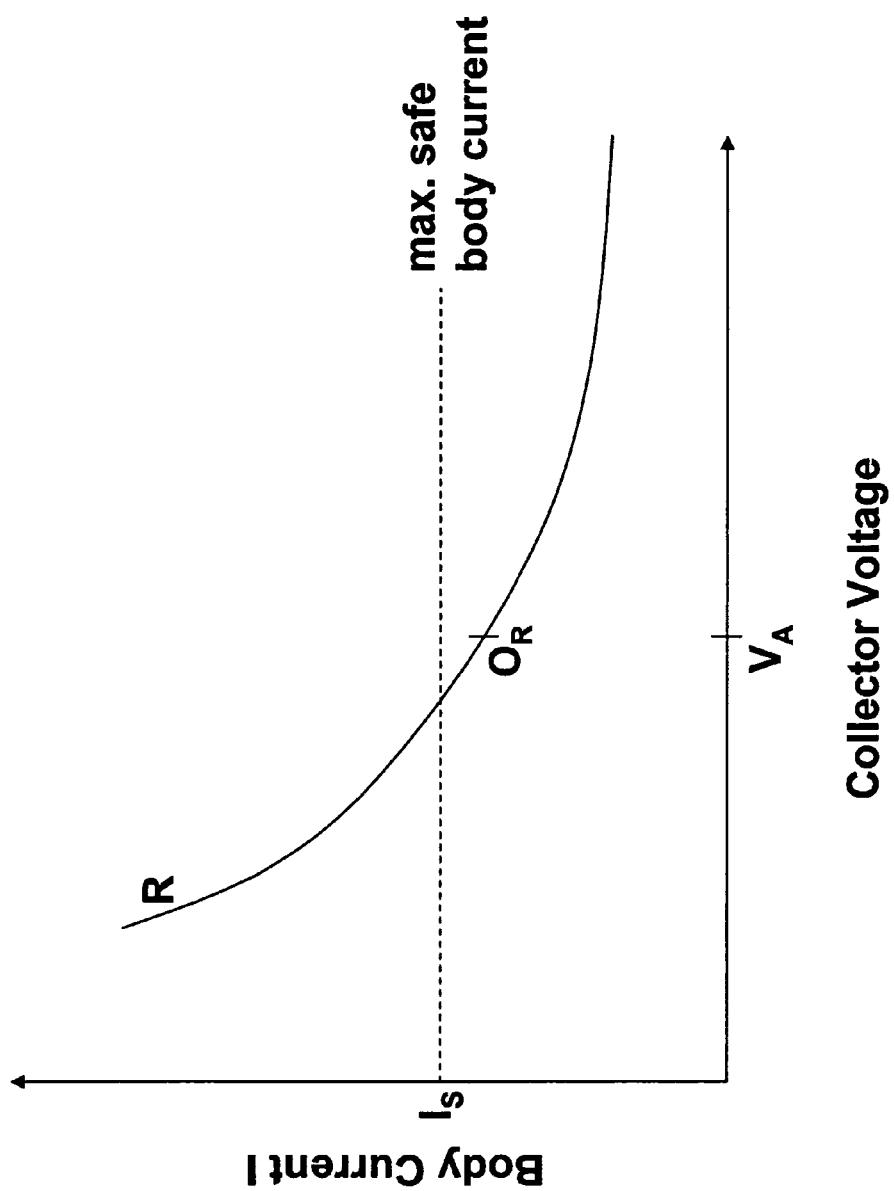
FIG. 2 is a graph plotting body I current as a function of collector electrode voltage V as the rated (or saturated) power curve R of a high power amplifier such as that of FIG. 1.

FIG. 2 is a plot showing body I current as a function of collector electrode voltage V as the rated (or saturated) power curve R of a high power amplifier such as that of FIG. 1. The design point $O_R$ is typically selected such that body current remains below a maximum safe level $I_S$. The voltage V of a collector electrode is selected consistent with this criterion and in this example is depicted at point $V_A$.

Figure 3:
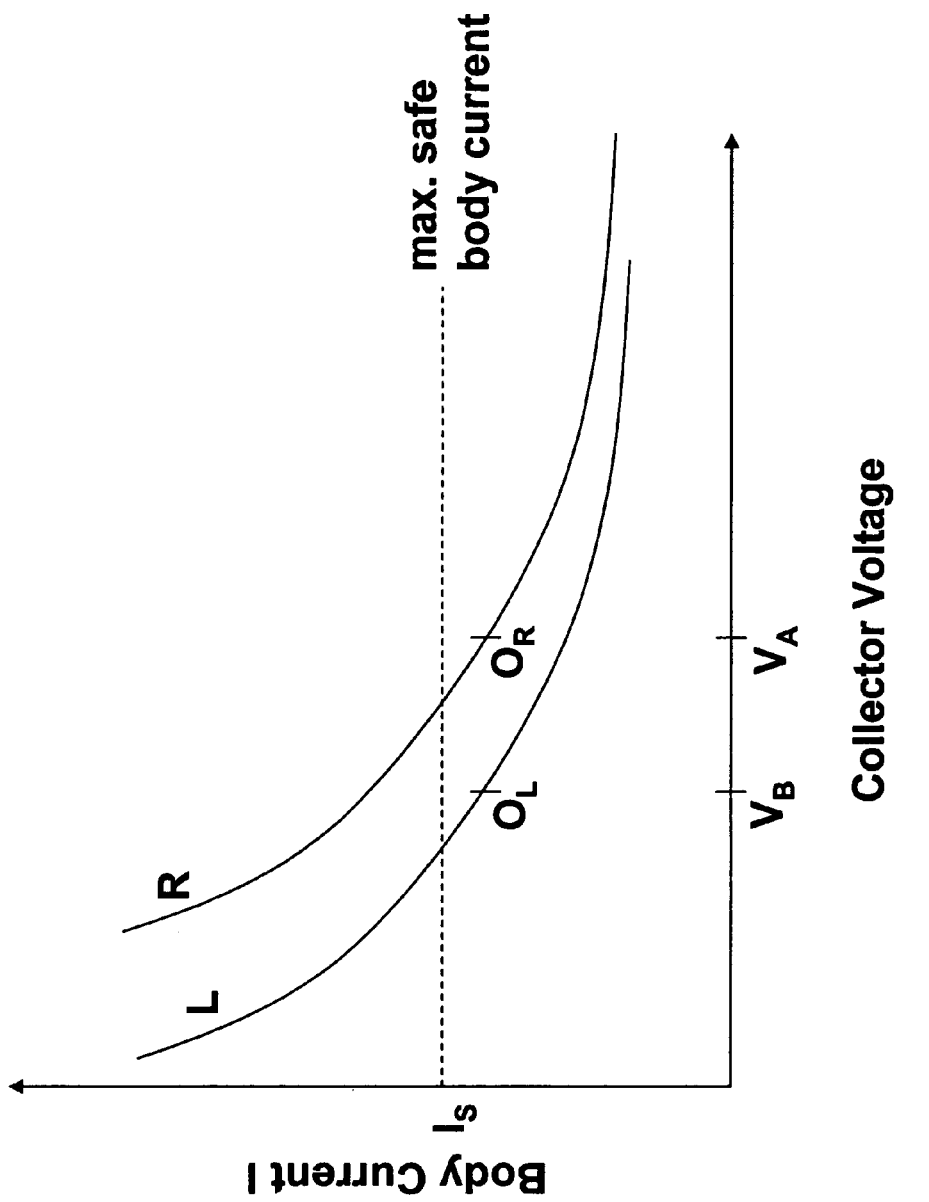
FIG. 3 is a graph showing a second curve L, in addition to the first curve R, the second curve L corresponding to operation at lower power for a smaller signal.

The safe operating point changes with RF power because the electron beam velocity spread changes as energy is extracted. FIG. 3 is a graph showing a second curve L, in addition to the first curve R. Curve L corresponds to operation at lower power for a smaller signal. The safe operating point for this curve is $O_L$, and the collector electrode voltage corresponding thereto is $V_B$. While still remaining below the maximum safe level $I_S$, the collector electrode voltage associated with the smaller signal is reduced, realizing a savings in operating cost. In particular, the voltage difference $V_A - V_B$ represents the power savings possible when the collector electrode voltage(s) is shifted based on the RF operating point.

Figure 4:
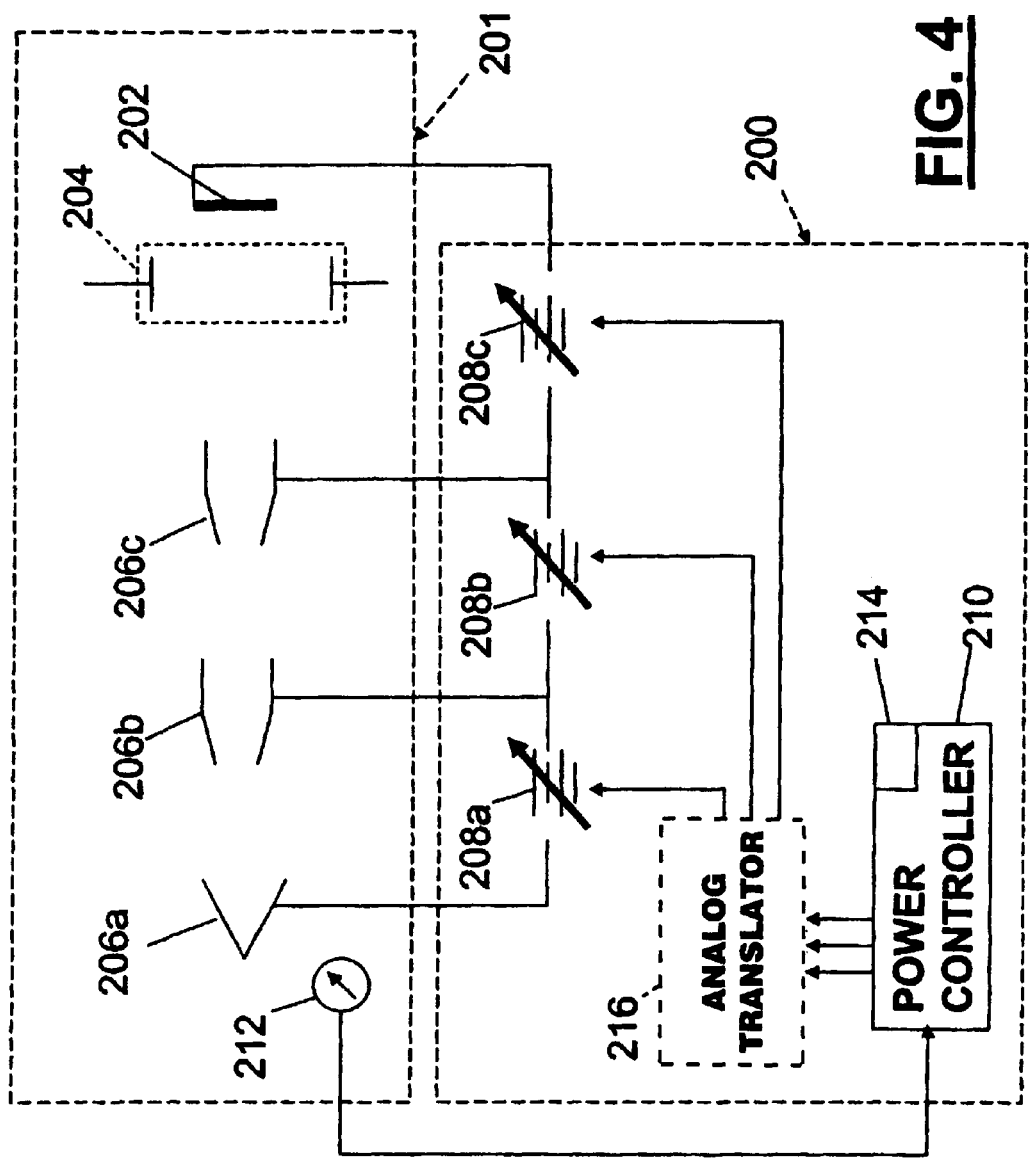
FIG. 4 is a schematic diagram of a high power amplifier system in accordance with the invention.

In order to achieve dynamic shifting of operational voltage of one or more collector stage electrodes, an arrangement as shown in FIG. 4 is used. FIG. 4 is a schematic diagram which depicting a biasing system 200 for a class of devices 201 which for convenience will be referred to as a high power amplifier, but which is to be understood to entail devices such as a traveling wave tube (TWT), klystron, extended interaction klystron (EIK), and a coupled cavity traveling wave tube (CCTWT), inductive output tube (IOT), and similar devices using what may generally be referred to as an electron tube.

In FIG. 4, a high power amplifier 201 having a cathode 202, anode 204, and a multi-stage depressed collector (MSDC) consisting of three collector electrodes 206a, 206b and 206c (hereinafter may be referred to collectively as collector stages or electrodes 206) is shown. A biasing system 200 including dynamically adjustable power supplies 208a, 208b and 208c (hereinafter may be referred to collectively as power supplies 208) provides biasing for the collector electrodes 206. The power supplies 208 are adjustable, for example through adjustment of associated voltage regulators (not shown) known to those skilled in the art. A power controller 210, which can be an internal digital controller common to most high power amplifiers, provides power level control signals to the dynamically adjustable power supplies 208 in accordance with the operational power level. An RF power measurement is made for this purpose, and a power level detect signal indicative of this measurement is provided to the power controller 210. RF power measurement can be conducted using a standard power meter 212 disposed in the high power amplifier 201, or alternatively, can be obtained from an external signal generated by an uplink system from a downstream (towards the antenna) detector. Typically, this signal is available from an output coupler feeding an RF diode or thermal sensor to create a DC voltage. This voltage can be used as an analog input, or digitally fed to the high power amplifier 201 to enable the dynamic depressed collector functionality.

As further detailed below, operating the high power amplifier 201 at other than maximum or saturation power can yield several benefits, including energy savings, cooling operating temperatures translating to higher Mean Time Before Failure (MTBF), reduced stress and temperature on the power supply, also translating to higher MTBF, and reduced size due reduced heatsink and fan capacity requirements.

Power controller 210 can include a look-up table (LUT) 214 containing power level values associated with each power supply 208 for high power operation and for low power operation. In this manner, the voltage levels of the collectors 206 can be moved dynamically based on the RF operating point. Depending on whether high power or low power operation is to be implemented, power controller 210 obtains the appropriate power level value for each of power supplies 208a, 208b and 208c from look-up table 214, and outputs these values to voltage regulators associated with each of the power supplies. An analog translator 216 can be used as necessary, or control can be exclusively digital. Of course it will be recognized that more than two power levels can be desired, and levels intermediate to the high and low levels are contemplated, in which case LUT 214 would contain entries corresponding to voltage values associated with the intermediate levels as well. In general, power curves such as those of FIGS. 1 and 2 associated with each collector stage of the amplifier are applicable and operational voltages of the collector stage(s) are obtained consistent with these power curves such that safe and efficient operation of the amplifier is realized. It will further be appreciated that the look-up table is populated with values appropriate to the particular amplifier configuration, and depends on whether that configuration contemplates a traveling wave tube (TWT), klystron, extended interaction klystron (EIK), inductive output tube (IOT), coupled cavity traveling wave tube (CCTWT), or the like.

While FIG. 4 depicts an MSDC having three stages, it will be recognized that the invention is applicable to any number of stages, less than or greater than three. Any depressed collector with at least one stage of depression is a candidate. Further, control of the collector electrode voltages can be performed independently for each collector electrode, or, alternatively, some or all the electrodes can have voltages that are tied together for tandem control. In the tandem control case, collectors having respective voltages for high RF power operation are decremented equally, for example by 30%, for low RF power operation. For a non-tandem case, by comparison, one collector voltage is decremented by one percentage, such as 30%, while the other is decremented by another percentage, such as 32%.

As an example, consider the case of a 2.25 kW TWT using the traditional voltage ratios for saturation power, in which case:

$P_O$=output power=2250 W $V_{C1}$=voltage in collector element 1=sixty five percent (65%)

$V_{C2}$=voltage in collector element 2=thirty percent (30%)

By comparison, for small signal range, up to 1200 watts:

$P_O$=output power=1200 watts $V_{C1}$=voltage in collector element 1=sixty five percent (65%)

$V_{C2}$=voltage in collector element 2=thirteen percent (13%)

In this case, since $V_{C1}$ is constant (65%), the savings in power is all in collector 2:

$V_{C2(sat)} - V_{C2(ssg)}$=30−13%=17%, where $V_{C2(ssg)}$ is voltage at small signal gain.

If all the current went to stage 2, the savings is:

17/30=56% saved.

However, since the current goes also to the first stage, it is likely that the savings at small signal will more accurately be around fifty percent (50%). At intermediate points, the saving will be around thirty percent (30%). As mentioned above, the power savings translates into several benefits for the user. These include energy savings on prime input AC (alternating current) line, translating into operating cost reduction of 30 to fifty 50 percent. They also include cooler operation of tube and therefore higher MTBF (mean time between failure), less stress and temperature on power supply components, again translating into higher MTBF, and reduced size of the high power amplifier as less heatsink and fan capacity is needed.

Figure 5:
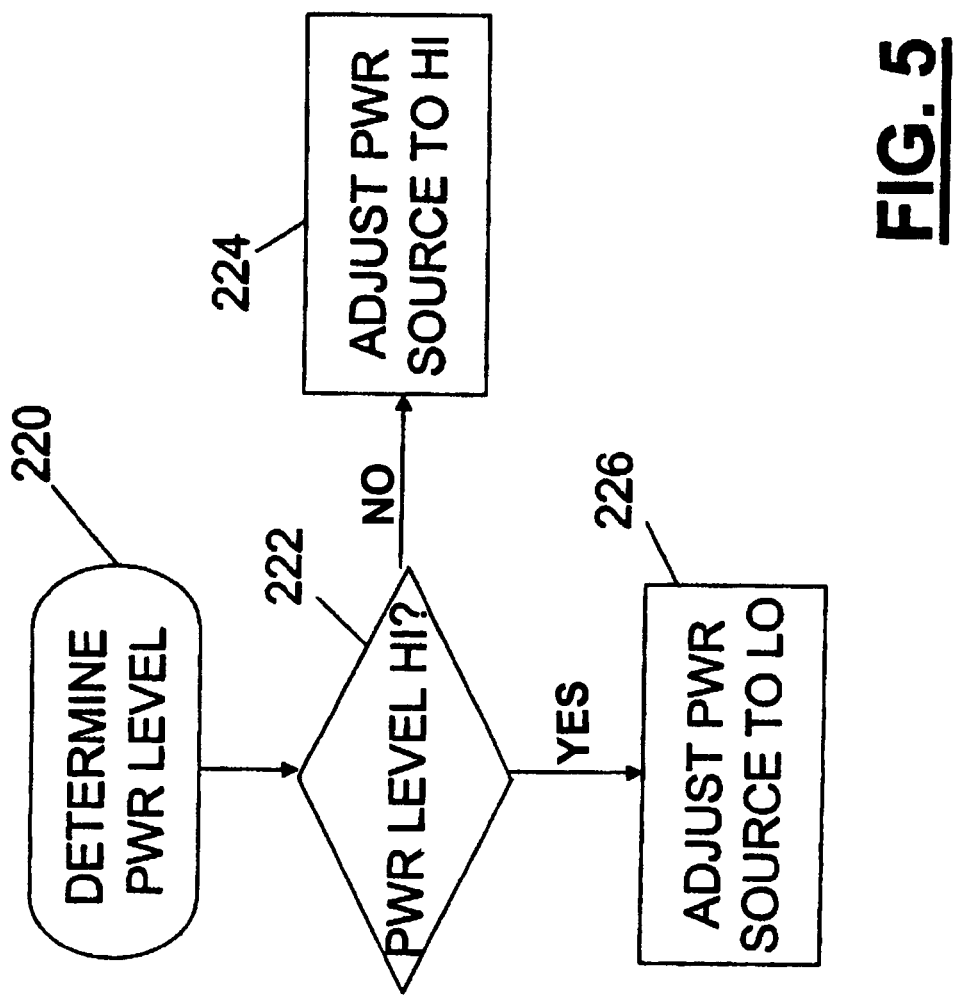
FIG. 5 is a flow diagram of a method of dynamically adjusting power of a high power amplifier in accordance with the invention.

FIG. 5 diagrammatically illustrates a process flow for dynamically adjusting power of a high power amplifier such as amplifier 201 to operate based on either high RF power operation or low RF power operation. It will be appreciated that such a process can readily be extended to operation at other, intermediate operational RF power levels. At 220, the operational power level is determined. At 222, a decision is made as to whether the power is at a high or low level. If at a high level, then electrode bias is adjusted to high at 224. If at low, it is adjusted to low at 226. While only described with reference to a single depressed electrode, it will be appreciated that the process is applicable for more than one electrode, and the adjustment of the multiple electrodes can be made independently or in tandem.

It will be appreciated that the uses of the system of the invention are not limited to terrestrial communications systems, but extend to those in spacecraft, which also use high power amplifiers that can be controlled in a similar manner.

The above are exemplary modes of carrying out the invention and are not intended to be limiting. It will be apparent to those of ordinary skill in the art that modifications thereto can be made without departure from the spirit and scope of the invention as set forth in the following claims.

The invention claimed is:

1. A biasing system for an electron tube having at least two collector stages, the biasing system comprising:
   at least one adjustable power source for biasing an electrode of one of the collector stages;
   a power controller having an output for driving the adjustable power source; and
   an analog translator for providing appropriate power level inputs to the adjustable power source,
   wherein the power controller accesses a look-up table to determine output level.

2. The system of claim 1, wherein the power controller drives the adjustable power source based on a measurement of RF power in the electron tube.

3. The system of claim 1, wherein the power controller drives the adjustable power source based on an external signal provided to the power controller.

* * * * *